United States Patent
Leddige et al.

(10) Patent No.: US 8,775,991 B2
(45) Date of Patent: Jul. 8, 2014

(54) INTERCHANGEABLE CONNECTION ARRAYS FOR DOUBLE-SIDED DIMM PLACEMENT

(71) Applicant: Intel Corporation, Santa Clara, CA (US)

(72) Inventors: Michael W. Leddige, Beaverton, OR (US); Kuljit Singh Bains, Olympia, WA (US); John Thomas Sprietsma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/888,627

(22) Filed: May 7, 2013

(65) Prior Publication Data

US 2013/0341790 A1    Dec. 26, 2013

Related U.S. Application Data (63) Continuation of application No. 13/339,525, filed on Dec. 29, 2011, now Pat. No. 8,438,515, and a continuation of application No. 11/899,497, filed on Sep. 5, 2007, now Pat. No. 8,099,687, and a continuation of application No. 10/792,350, filed on Mar. 2, 2004, now abandoned.

(51) Int. Cl.
*G06F 17/50*     (2006.01)

(52) U.S. Cl.
USPC ......................................................... 716/110

(58) Field of Classification Search
USPC ......................................................... 716/110
See application file for complete search history.

(56) References Cited

U.S. PATENT DOCUMENTS

| | | | |
|---|---|---|---|
| 5,208,782 A * | 5/1993 | Sakuta et al. | 365/230.03 |
| 5,448,516 A | 9/1995 | Tsukikawa et al. | |
| 5,463,253 A | 10/1995 | Waki et al. | |
| 6,202,110 B1 | 3/2001 | Coteus et al. | |
| 6,307,769 B1 | 10/2001 | Nuxoll et al. | |
| 6,433,422 B1 * | 8/2002 | Yamasaki | 257/725 |
| 6,442,056 B2 | 8/2002 | Nuxoll et al. | |
| 6,449,166 B1 | 9/2002 | Sly et al. | |
| 6,490,188 B2 | 12/2002 | Nuxoll et al. | |
| 6,574,724 B1 | 6/2003 | Hoyle et al. | |
| 6,992,940 B1 | 1/2006 | Tauber | |
| 7,072,201 B2 | 7/2006 | So et al. | |

(Continued)

FOREIGN PATENT DOCUMENTS

| | | |
|---|---|---|
| CN | 1926632 A | 3/2007 |
| JP | 2003-264240 A | 9/2003 |

(Continued)

OTHER PUBLICATIONS

Office Action received for European Application No. 05713488.4, mailed on Aug. 16, 2007, 3 pages.

(Continued)

*Primary Examiner* — Suchin Parihar
(74) *Attorney, Agent, or Firm* — Caven & Aghevli LLC (57) ABSTRACT

A memory module has an array of connections. The array of connections is arranged in rows and columns such that there are first and second outer columns. Connections in the first and second outer columns can be interchanged to optimize double-side module placement on a substrate. Other embodiments are also disclosed and claimed.

7 Claims, 6 Drawing Sheets

(56) References Cited

U.S. PATENT DOCUMENTS

| | | | |
|---|---|---|---|
| 7,200,022 B2 | 4/2007 | Martin et al. | |
| 7,260,691 B2* | 8/2007 | Bains | 711/154 |
| 7,404,032 B2* | 7/2008 | Ware et al. | 711/105 |
| 7,589,409 B2 | 9/2009 | Gibson et al. | |
| 8,009,869 B2 | 8/2011 | Kumon | |
| 8,135,890 B2* | 3/2012 | Woo et al. | 710/100 |
| 2001/0022740 A1 | 9/2001 | Nuxoll et al. | |
| 2002/0044476 A1* | 4/2002 | Nuxoll et al. | 365/63 |
| 2003/0107908 A1 | 6/2003 | Jang et al. | |
| 2003/0198031 A1* | 10/2003 | Peterson | 361/760 |
| 2004/0012991 A1* | 1/2004 | Kozaru | 365/52 |
| 2004/0230932 A1* | 11/2004 | Dickmann | 716/10 |
| 2005/0007807 A1 | 1/2005 | Martin et al. | |
| 2005/0030815 A1 | 2/2005 | Matsumoto et al. | |
| 2005/0036350 A1 | 2/2005 | So et al. | |
| 2005/0166026 A1* | 7/2005 | Ware et al. | 711/167 |
| 2005/0195629 A1 | 9/2005 | Leddige et al. | |
| 2006/0004981 A1* | 1/2006 | Bains | 711/202 |
| 2006/0146637 A1 | 7/2006 | Vogt | |
| 2006/0171247 A1 | 8/2006 | Hoppe et al. | |
| 2006/0221752 A1 | 10/2006 | Fasoli et al. | |
| 2006/0233037 A1 | 10/2006 | Dickman | |
| 2008/0101105 A1 | 5/2008 | Muff | |
| 2009/0300260 A1* | 12/2009 | Woo et al. | 710/316 |
| 2012/0110229 A1* | 5/2012 | Woo et al. | 710/105 |

FOREIGN PATENT DOCUMENTS

| | | | |
|---|---|---|---|
| JP | 2007-525769 A | 9/2007 | |
| JP | 2007-288282 A | 11/2007 | |
| JP | 2009-293938 A | 12/2009 | |
| JP | 2011-031779 A | 2/2011 | |
| TW | I295063 B | 3/2008 | |
| WO | 2005/093757 A1 | 10/2005 | |

OTHER PUBLICATIONS

Office Action received for U.S. Appl. No. 10/792,350, mailed on May 24, 2007, 14 pages.
Office Action received for U.S. Appl. No. 10/792,350, mailed on Nov. 20, 2006, 9 pages.
Office Action received for U.S. Appl. No. 11/899,497, mailed on Apr. 3, 2008, 10 pages.
Office Action received for U.S. Appl. No. 11/899,497, mailed on Nov. 7, 2008, 11 pages.
Notice of Allowance Received for U.S. Appl. No. 11/899,497 mailed on Jul. 27, 2011, 8 pages.
Office Action Received for U.S. Appl. No. 11/899,497, mailed on Jun. 3, 2010, 10 pages.
Office Action Received for U.S. Appl. No. 11/899,497, mailed on Nov. 13, 2009, 8 pages.
Office Action Received for U.S. Appl. No. 11/899,497, mailed on Dec. 6, 2010, 12 pages.
Notice of Allowance received for U.S. Appl. No. 13/339,525, mailed on Jan. 3, 2013, 9 pages.
Office Action received for U.S. Appl. No. 13/339,525, mailed on Jul. 3, 2012, 9 pages.
Notice of Office of Allowance Received for Chinese Patent Application No. 200580006652.5, mailed on Mar. 23, 2011, 2 pages of Office Action and 2 pages of English Translation.
Office Action Received for Chinese Patent Application No. 200580006652.5, mailed on Aug. 4, 2010, 3 pages of Office Action and 5 pages of English Translation.
Office Action received for Chinese Application No. 200580006652.5, mailed on Dec. 12, 2008, 4 pages of Office Action and 3 pages of English Translation.
Office Action Received for Chinese Patent Application No. 200580006652.5, mailed on Jan. 22, 2010, 6 pages of Office Action and 5 pages of English Translation.
Office Action received for Japanese Patent Application No. 2007-500868, mailed on Sep. 1, 2009, 3 pages of Office Action and 3 pages of English Translation.
Office Action received for Taiwanese Application No. 94104530, mailed on Oct. 31, 2007, 2 pages of Office Action and 2 pages of English Translation.
International Search Report and Written Opinion received for PCT Application No. PCT/US2005/004595, mailed on Jun. 20, 2005, 9 pages.
International Preliminary Report on Patentability Received for Patent Application No. PCT/US2005/004595, mailed on Sep. 14, 2006, 5 pages.

* cited by examiner

| | 51 | 52 | 53 | 54 | 55 | 56 | 57 | 58 | 59 |
|---|---|---|---|---|---|---|---|---|---|
| A | VSS | DQ15 | VDD | | | | VDD | DQ14 | VSS |
| B | DQ13 | DQ11 | VSSQ | | | | VSSQ | UDQS# | DQ12 |
| C | DQ9 | DQ8 | VDDQ | | | | VDDQ | UDQS | DQ10 |
| D | VDD | ZQ | VSSQ | | | | VSSQ | RFU | VDD |
| E | LDM | LDQS# | VDDQ | | | | VDDQ | DQ5 | UDM |
| F | DQ7 | LDQS | VSSQ | | | | VSSQ | DQ4 | DQ6 |
| G | DQ3 | DQ1 | VDDQ | | | | VDDQ | DQ0 | DQ2 |
| H | VDDQ | ODT | VDD | | | | CLK | CKE | VREF_DQ |
| J | VDD | RFU | RAS | | | | CLK# | RFU | VDD |
| K | VSS | CS | CAS | | | | VSS | RST | VSS |
| L | VDD | RFU | WE | | | | A10/AP | VREF_CA | VDD |
| M | VDD | VDD | BA2 | | | | BA3/A15 | VDD | BA1 |
| N | BA0 | A3 | A0 | | | | A11 | A4 | VSS |
| P | VSS | VDD | A2 | | | | A1 | VDD | A6 |
| R | A5 | A7 | A9 | | | | A12 | A8 | VDD |
| T | VDD | VDD | A13 | | | | A14 | VDD | VSS |
| | VSS | | | | | | | | |

| | 51 | 52 | 53 | 54 | 55 | 56 | 57 | 58 | 59 |
|---|---|---|---|---|---|---|---|---|---|
| A | VDD | DQ15 | VDDQ | | | | VSSQ | DQ14 | VSS |
| B | DQ13 | DQ11 | VSSQ | | | | VDDQ | UDQS# | DQ12 |
| C | DQ9 | DQ8 | VDDQ | | | | VSSQ | UDQS | DQ10 |
| D | VDD | ZQ | VSSQ | | | | VDDQ | RFU | UDM |
| E | LDM | LDQS# | VDDQ | | | | VSSQ | DQ5 | VSS |
| F | DQ7 | LDQS | VSSQ | | | | VDDQ | DQ4 | DQ6 |
| G | DQ3 | DQ1 | VDDQ | | | | VSSQ | DQ0 | DQ2 |
| H | VSS | CS | RAS | | | | CLK | CKE | VREF_DQ |
| J | VDD | RFU | CAS | | | | CLK# | RFU | VSS |
| K | VSS | VREF_CA | WE | | | | A10/AP | RST | VDD |
| L | VDD | BA0 | BA2 | | | | BA3/A15 | BA1 | VSS |
| M | A3 | VSS | A0 | | | | A11 | VDD | A4 |
| N | VDD | A5 | A2 | | | | A1 | A6 | VSS |
| P | A7 | VDD | A9 | | | | A12 | VDD | A8 |
| R | VSS | VDD | A13 | | | | A14 | VSS | VDD |

Figure 9

INTERCHANGEABLE CONNECTION ARRAYS FOR DOUBLE-SIDED DIMM PLACEMENT

RELATED APPLICATION

The present application is a continuation of U.S. patent application Ser. No. 13/339,525, filed Dec. 29, 2011 entitled "INTERCHANGEABLE CONNECTION ARRAYS FOR DOUBLE-SIDED DIMM PLACEMENT", and now U.S. Pat. No. 8,438,515, which is a continuation of Ser. No. 11/899,497, filed on Sep. 5, 2007, entitled "INTERCHANGEABLE CONNECTION ARRAYS FOR DOUBLE-SIDED DIMM PLACEMENT", and now U.S. Pat. No. 8,099,687, which is a continuation of U.S. patent application Ser. No. 10/792,350, filed on Mar. 2, 2004, entitled "INTERCHANGEABLE CONNECTION ARRAYS FOR DOUBLE-SIDED DIMM PLACEMENT", which are hereby incorporated herein by reference in their entirety and for all purposes.

BACKGROUND

Currently, memory packages, such as dual, in-line memory modules (DIMM) may reside on both sides of a printed circuit board (PCB) or other substrate. This increases memory density for the system. Signals for the memories may route through the substrate, which may have several layers. With memory packages on both sides of the substrate, signal routing and integrity may become an issue.

Signals being routed through the substrate may connect to balls or connections to the DIMM on opposite sides of the packages. For examples, signals going to the closest side of the package on the one side of the substrate will generally end up having to go to the farthest side of the package on the other side of the substrate. The DIMM for the other side of the package is turned 'upside down' to mount it on the other side, causing the relevant connection to be on the other side of the package from the signal origination.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figures 1, 2:
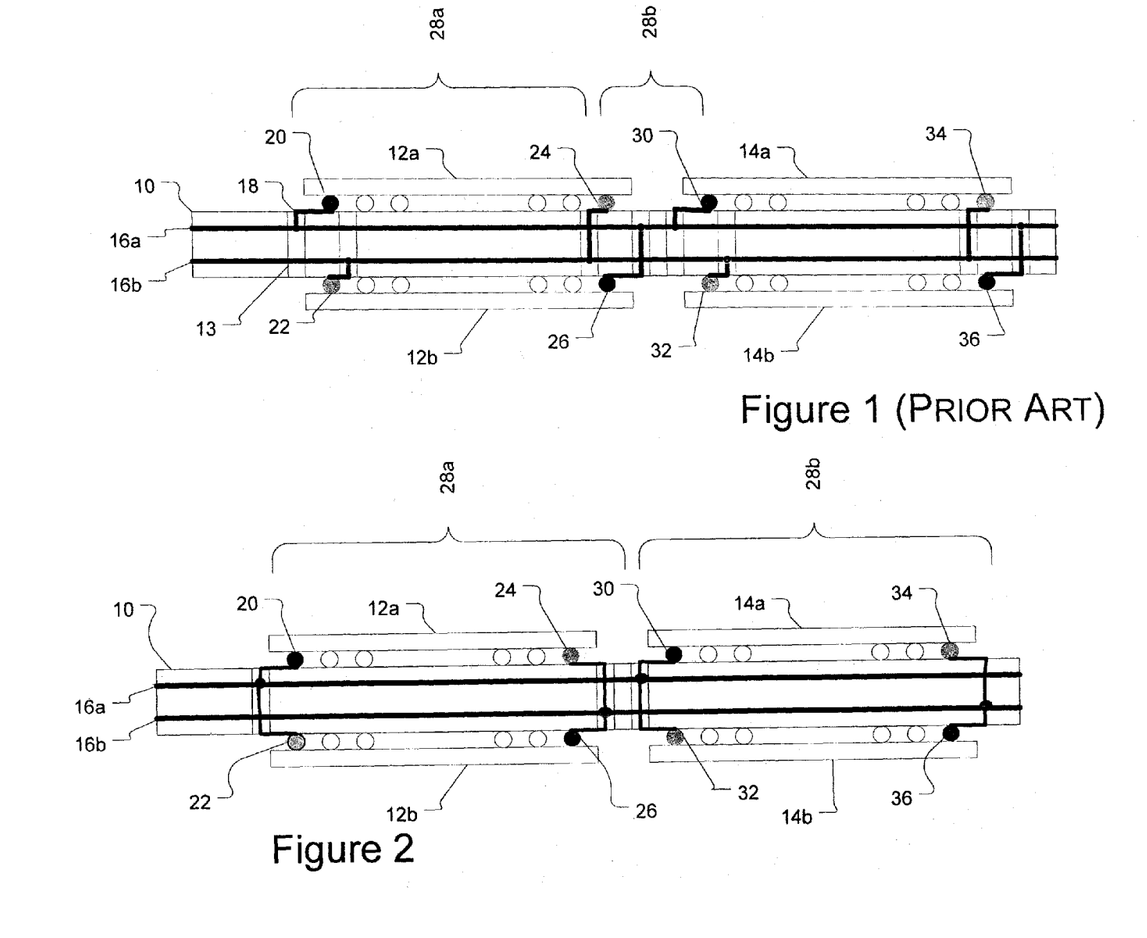
FIG. 1 shows a prior art embodiment of a double-sided, dual, in-line memory module mounting.
FIG. 2 shows an embodiment of a double-sided, dual, in-line memory module mounting.

FIG. 1 shows a prior art embodiment of a double-sided, dual, in-line memory module (DIMM) mounting on a substrate. Double-sided refers to the fact that the memory modules are mounted on opposite sides of the substrate. The substrate 10 may be a multi-layered PCB, or any other substrate upon which DIMMs are mounted. Memory modules 12a and 12b are mounted on opposite sides of the substrate from each other, as are memory modules 14a and 14b. The substrate 10 has internally routed signal traces 16a and 16b. Stub 18 through via 13 allows the solder ball or other connection from the module 12a to connect to the first signal trace 16a.

The via 13 is manufactured on a larger pitch than the signal traces to afford extra width, and the use of several vias can limit the number of traces that can be routed through a single layer of the substrate 10. This may force additional layers and extra costs. In addition, to avoid shorting signals into the internal power and ground plane layers of the substrate 10, anti-pads are typically used in the power plane layers, which compromise power delivery to the memories within the modules.

Double-data rate memory (DDR) uses both the rising and falling edges of a clock signal to operate the memory, resulting in twice the speed of memories using either the leading or the falling edge of the clock signal. DDR3 is the third version of DDR. In DDR3, as well as other memory types, the command/address bus is a daisy-chained or 'fly-by' bus. This type of bus may have problems with signal integrity due to the unequal routing lengths caused by double-sided memory mounting.

As shown in FIG. 1, signal 16a has a first routing length 28a between the connections 20 and 26. The second routing length is between connection 26 on module 12b and ball 30 on module 14a. The second routing length 28b is far shorter than the first. A similar length difference occurs for signal 16b, with the first routing length being from connection 22 to connection 24, and the second routing length being from connection 24 on module 12a to connection 32 on module 14b. It must be noted that connections 20, 22, 24, 26, 30, 32, 34 and 36, are shown here as solder balls, but could be any type of connection used to provide connection between the integrated circuit die and the substrate.

The difference in routing lengths results in non-uniform effective channel impedance. This limits the ability of the devices to receive recognizable signals. Typically, systems are designed to have very regularly and evenly spaced loads and the line is tuned to match the loads. If there is no impedance matching, the signal integrity becomes questionable and higher data rates cannot be supported.

In one approach, the prior art has attempted to perform routing in the semiconductor of the die itself. Connections are redefined to be a different signal using logic in the die to 'mirror' the signal. Logic required in the data path introduces latency in the path, as well as overhead into the device manufacture.

It is possible to interchange the physical connectivity of the various connections at the memory module level, avoiding introduction of logic in the data path, while providing the same benefits as mirroring. An example is shown in FIG. 2.

The routing lengths in this embodiment have become uniform. The term 'uniform' as used here does not mean that they are exactly the same, although that may be the case. Uniformity, as used here, means that the impedances in the signal paths are closely matched to each other between loads. Routing length 1 is now the length from the connection 20 to the connection 30, and routing length 2 is the length from the connection 30 to the connection for the same signal on the next device, not shown. The loads are now more uniformly spaced, which allows the devices to support higher data rates with good signal integrity.

In addition, the configuration shown in FIG. 2 has a reduced number of vias. The interchange of signals from the far side of the bottom-side memory modules 12b and 14b have moved to the near side allow the signals to share vias. Reducing the number of vias eases the restrictions on trace spacing, allowing more traces to be placed in a given layer. In turn, this may reduce the number of layers needed in the substrate, reducing costs, as well as mitigating shorts in the power and ground planes.

Figure 3:
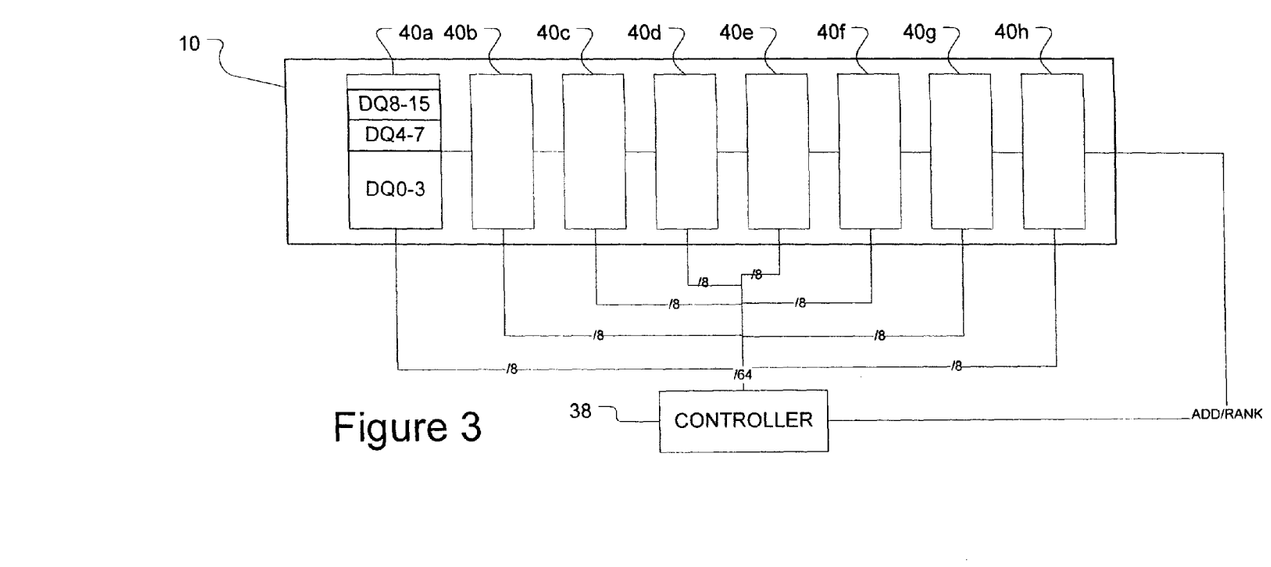
FIGS. 3a and 3b show alternative arrangements of memory packages on a substrate.

In order for this approach to be practical, there must be some signals that can be interchanged between the two sides of the module. In order to allow better understanding of the definition of interchangeable signals, it is helpful to discuss how memory modules are typically laid out on a substrate. As shown in FIG. 3, a memory controller 38 has a data output of 64 bytes. Each module 40a-40h on the substrate 10 is a X8 module; each one can receive 8 bytes of memory.

It must be noted that in one embodiment of the invention, the interchangeable signals can be selected such that the footprint of the different types of packages can be optimized. As shown in memory module 40a, for example, the data lines have been arranged such that is the package is a X4/X8 package, the data lines are either DQ0-3 for a X4 memory, or DQ0-7 for a X8 package. If the package is a X16 package, all of the data lines are present and DQ0-15 are available for interchangeability. Also, while data lines may be interchangeable within a byte 'lane,' such as DQ[0:7] and DQ[8:15], the adaptability of the interchangeable signals to different package types is enhance if the interchangeability is limited to be within nibbles, such as DQ[0:3], DQ[4:7], DQ[8:11] and DQ[12:15].

Interchangeability actually occurs at the controller 38. The DRAM and the DIMM have no 'knowledge' of what is on any data, whether that data is actually for DQ1 or DQ15. Therefore, these signals are interchangeable. Other types of signals have been identified as being interchangeable, as will be discussed further on. It must be noted that while the data out of the controller is 64 bytes, there are also address and rank-based signals that are sent from the controller in a daisy-chained or 'fly-by' fashion. The signals are passed along a bus and it is the distance between the relevant connections to this bus for which the routing length is desired to be uniform. The interchanging of the signals transmitted from the connections as shown in FIG. 2 is what provides this uniformity.

Figure 4:
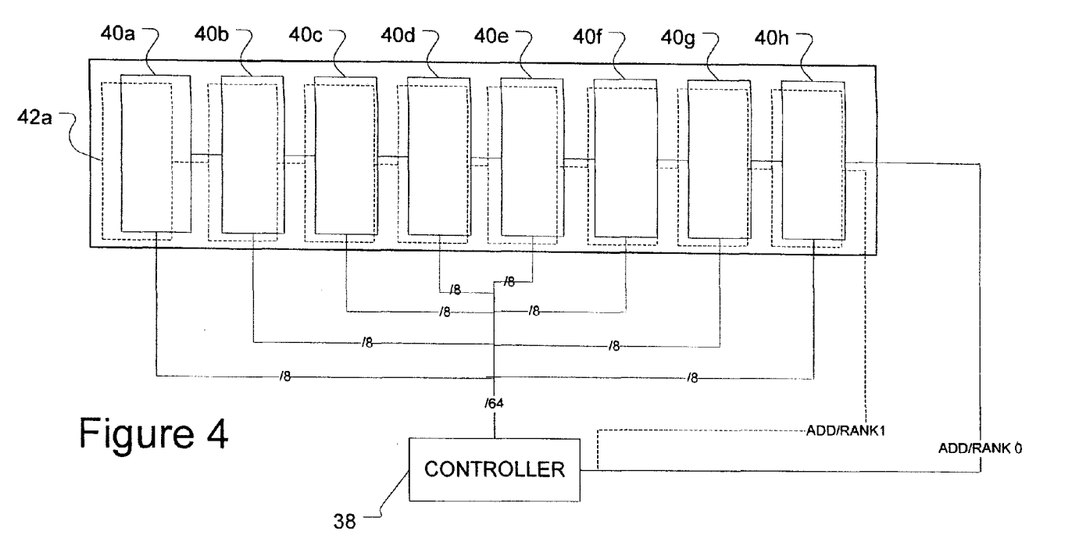
FIG. 4 shows an embodiment of a memory system using double-sided memory modules.

Interchangeability is possible in most memory layouts. For example, the memory system in FIG. 4 employs double-sided memory substrates. In addition to the modules 40a-40h on the side facing the viewer, modules such as 42a are on the side away from the viewer. Memory modules arranged in such a system are generally addressed using rank-based signals, such as chip select (CS). In this particular embodiment, the address and rank based signals for the two different ranks are shown coming out of the controller. Generally, rank-based signals are not interchangeable.

Figure 5A:
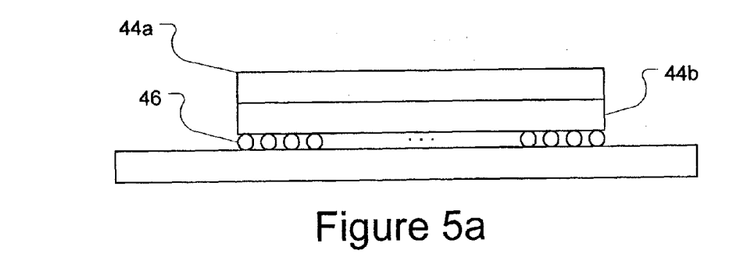
FIGS. 5a and 5b show alternative embodiments of stacked memory modules.
Figure 5B:
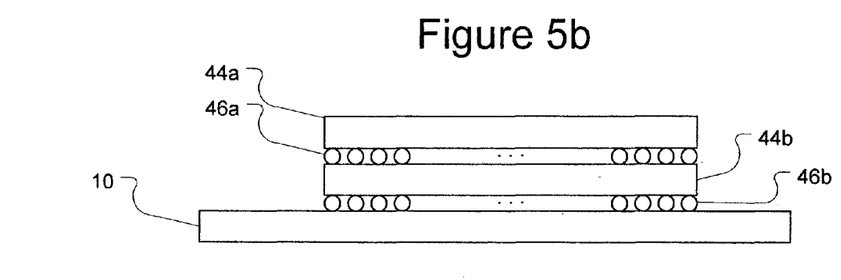

Similarly, interchangeability can be performed using 'stacked' memory modules, such as those shown in FIGS. 5a and 5b. FIG. 5a shows an example of a stacked memory arrangement where the connections between the two memory dies 44a and 44b are internal and they use a common connection array such as ball 46. In FIG. 5b, each module 44a and 44b have their own external connection array, such as solder balls 46a and 46b. Interchangeability can be employed in this arrangement as well.

Modules are generally arranged as an array of connections, in rows and columns. As will be discussed with regards to FIGS. 6-8, the arrangement of the connections will be assumed to be in at least four columns, although three columns are possible. This assumption is based upon a typical DRAM layout of 15 or 16 rows of connections by 9 columns. Generally there are no connections in the middle 3 columns, leaving 3 columns on either 'side' of the module.

In the discussion of interchangeable signals, several different signal abbreviations may be used. These are included with their descriptions in the table below.

| Abbreviation | Signal Name | Comments |
| --- | --- | --- |
| VSS | Core ground | Usually tied together at substrate |
| VSSQ | I/O ground | |
| VDD | Core power | Usually tied together at substrate |
| VDDQ | I/O power | |
| RFU | Reserved for future use | |
| CLK/CLK# | DRAM input clock | |
| DQ[0:15] | Data signals | Lower and upper bytes (0:7, 8:15) |
| DQS/DQS# | Strobes for data clock into the DRAM | One for upper and lower bytes |
| DM | Data mask signal | One for upper and lower bytes |
| VREFDQ | Voltage reference pin for data | |
| CS | Chip select | |
| CKE | Clock enable | |
| ODT | On-die termination | |
| RAS | Row address select | |
| CAS | Column address select | |
| WE | Write enable | |
| RST | Reset | |
| ZQ | Impedance calibration pin | |
| sCS | Stacked chip select | |
| sCKE | Stacked clock enable | |
| sODT | Stacked on-die termination | |
| sZQ | Stacked impedance calibration pin | |
| A[0:15] | Address | |
| BA[0:3] | Bank address | |
| VREFCA | Voltage reference for command/address | |

Interchangeable signals will generally include DQ signals within a byte 'lane' such as DQ[0:7] and DQ[8:15]. Bank addresses, BA[0:3] may be interchangeable. It is possible that BA[2:3] are not present, so only BA[0:1] may be interchanged. Address connections within a row, such as A[3:9] are interchangeable. Generally, VDD and VSS connection locations can be moved around to share vias as well, although this is not shown in the example.

Figure 6:
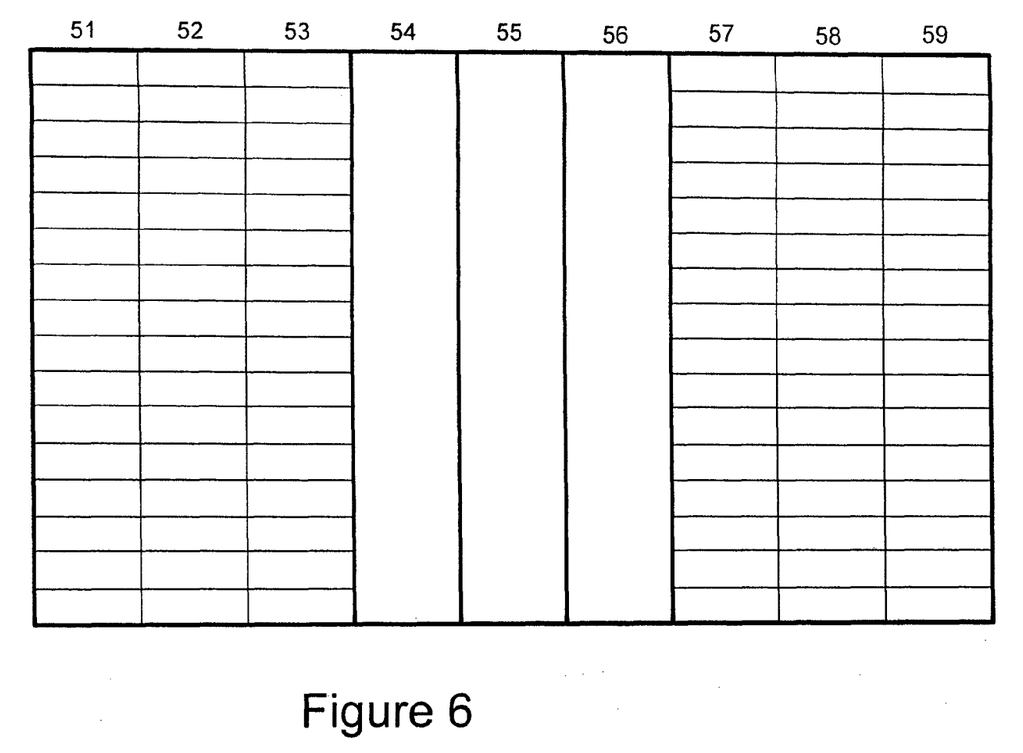
FIG. 6 shows a connection diagram for an embodiment of a dual, in-line memory module having interchangeability.

FIG. 6 shows a general embodiment of a memory module layout to allow for interchangeable signals. As can be seen, the example is a 16×9 array of connections. The array has been arranged in nine columns, with the outer two columns 51, 52, 58 and 59 on either side being identified as for use by interchangeable signals and the middle two columns 53 and 56 being identified as for use by non-interchangeable signals. The outer two columns on each side may be interchangeable providing four interchangeable columns, or only the outer one column on each side providing only two interchangeable columns.

Figure 7:
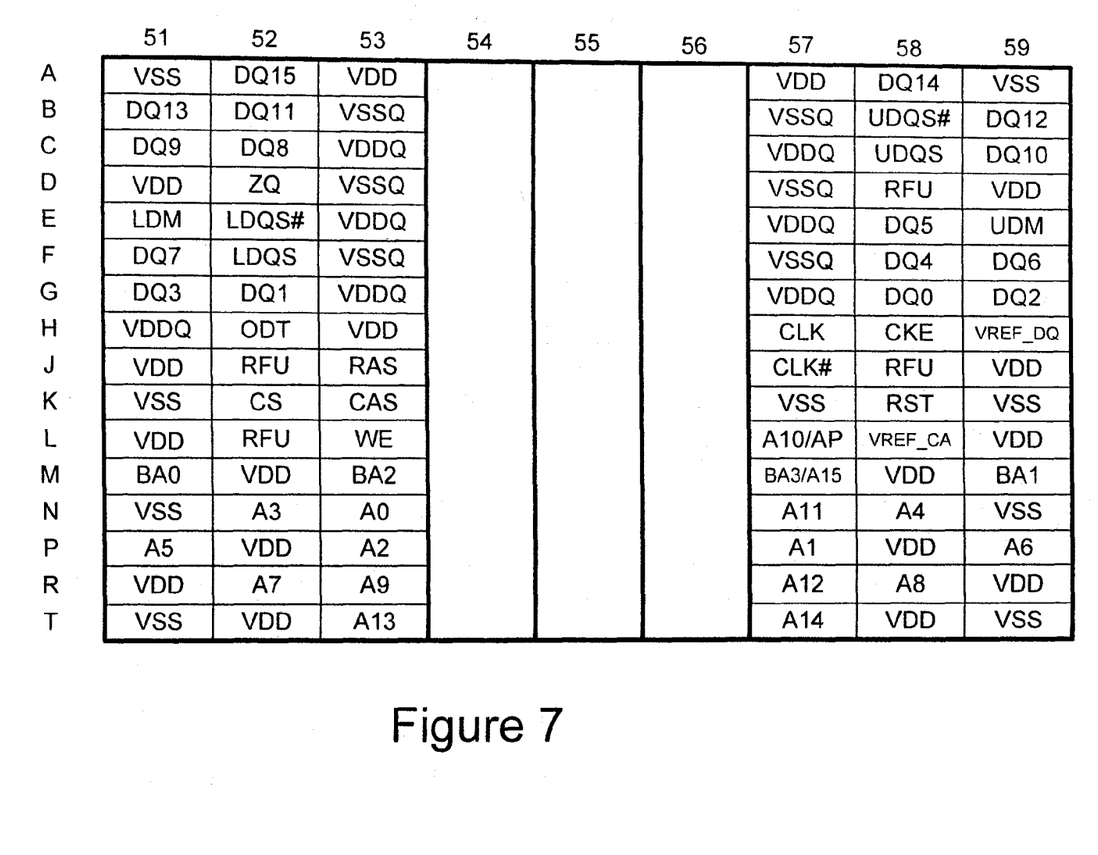
FIG. 7 shows a connection diagram for an alternative embodiment of a dual, in-line memory module.

A more specific embodiment of a connection 16×9 layout is shown in FIG. 7. In this example, VDDQ and VSSQ have had their locations redefined to share vias front to back. Further, A3 and A4, A5 and A6, and A7 and A8 can share vias at the DIMM level. This particular layout has a further advantage that there are only 4 signals per row of the DIMM, allowing better trace separation for the signal traces, further increasing the signal integrity. Reserved for future use (RFU) connections at column 52, rows J and L may be used for sODT, and sCS. Similarly, RFU at column 58, row J could be used for sCKE, and at row D for sZQ.

Figure 8:
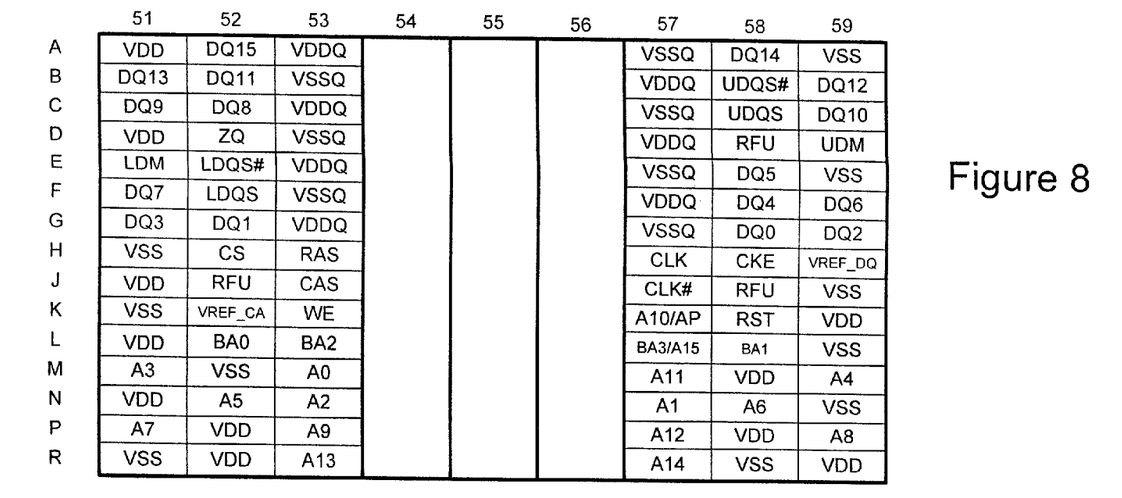
FIG. 8 shows a connection diagram for another alternative embodiment of a dual, in-line memory module.
Figure 9:
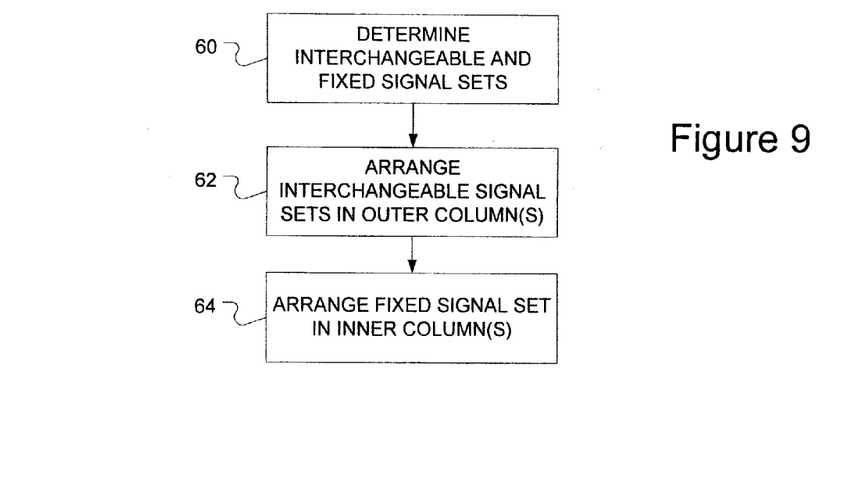
FIG. 9 shows a block diagram of an embodiment of a method to design dual, in-line memory module.

It is possible to get a 15×9 connection layout with some modifications of these rules. If a 2:1 ration of signal to ground pattern can be achieved, and 2 connections are removed, it is possible to achieve a 15×9 connection layout with interchangeable connections. An embodiment of this is shown in FIG. 8. In this embodiment, the ODT signal has been removed and the bank address 3, BA3 and address 15, A15, share a connection. The RFU connection at column 52, row L becomes BA0.

With these possible layouts in mind, it is helpful to return to FIGS. 1 and 2. Imagine that the connections 20 and 22 correspond to a location in column 1 of a connection array, and connections 24 and 26 correspond to a location in column 9. In FIG. 1, this results in the uneven routing lengths and the extra vias. If the controller were to interchange the signals between columns 1 and 9, moving the signals that had previously been using connection 22 to column 9 and the signals previously using connection 26 to column 1, the result would appear as in FIG. 2. The connections 22 and 26 remain in the same place, the signals that had been routed to those columns are interchanged so that connections 20 and 22, and 24 and 26 can be connected together. The availability of interchangeable signals between the outer columns of the connection array allow for the optimization of the connection layout for double-sided DIMM or other module placement.

Further adjustments and variations on the interchangeable signals are of course possible. For example, the interchangeable signals can also be applied to stacked DRAM technology. In addition, variations of the package type can be employed. For example, the X16 package type may be used, as well as the X4/X8 package type.

Thus, although there has been described to this point a particular embodiment for a method and apparatus for interchangeable connections in a memory module, it is not intended that such specific references be considered as limitations upon the scope of this invention except in-so-far as set forth in the following claims.

The invention claimed is:

1. A memory module, comprising:
a first memory device having a first solder ball connector, wherein the first solder ball connector is to provide a transmission path for an electric signal of a first designation to pass between the memory module and the first memory device, the first solder ball connector coupled to a first via;
a second memory device having a second solder ball connector, wherein the second solder ball connector is to provide a transmission path for an electrical signal of the first designation to pass between the memory module and the second memory device, the second solder ball connector coupled to a second via; and
a third memory device having a third solder ball connector, wherein the third solder ball connector is to provide a transmission path for an electrical signal of the first designation to pass between the memory module and the third memory device, the third solder ball connector coupled to a third via,
wherein a first inter memory device trace electrically couples the first solder ball connector to the second solder ball connector and a second inter memory device trace couples the second solder ball connector to the third solder ball connector, and wherein to match an impedance of the first inter memory device trace with an impedance of the second inter memory device trace the first and second trace are substantially the same length.

2. The memory module of claim 1, wherein the first, second, and third memory devices comprise dynamic random access memory (DRAM) devices.

3. The memory module of claim 1, further comprising a substrate to couple a plurality of components of the memory module.

4. The memory module of claim 3, further comprising a set of outer connections to couple the first memory device and/or the second memory device to the substrate.

5. The memory module of claim 3, wherein the substrate is to comprise a multi-layered printed circuit board.

6. The memory module of claim 3, wherein the substrate is to provide a double-sided memory module.

7. The memory module of claim 1, wherein the first, second, and third memory devices comprise dual, in-line memory module (DIMM).

* * * * *